United States Patent
Inanami et al.

(10) Patent No.: US 8,071,263 B2
(45) Date of Patent: Dec. 6, 2011

(54) REFLECTIVE MASK AND MANUFACTURING METHOD FOR REFLECTIVE MASK

(75) Inventors: Ryoichi Inanami, Kanagawa (JP); Yumi Nakajima, Tokyo (JP); Masamitsu Itoh, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 150 days.

(21) Appl. No.: 12/490,910

(22) Filed: Jun. 24, 2009

(65) Prior Publication Data
US 2010/0021826 A1    Jan. 28, 2010

(30) Foreign Application Priority Data
Jul. 28, 2008    (JP) .................................. 2008-193131

(51) Int. Cl.
G03F 1/00    (2006.01)
G03F 1/08    (2006.01)
(52) U.S. Cl. ......................................................... 430/5
(58) Field of Classification Search .................. 430/5
See application file for complete search history.

(56) References Cited

U.S. PATENT DOCUMENTS

| 6,699,625 | B2 | 3/2004 | Lee et al. | |
|---|---|---|---|---|
| 2003/0162104 | A1* | 8/2003 | Shoki | 430/5 |
| 2003/0228529 | A1* | 12/2003 | Dieu et al. | 430/5 |
| 2007/0077499 | A1* | 4/2007 | Ikuta et al. | 430/5 |

FOREIGN PATENT DOCUMENTS
JP    2006-13494    1/2006
* cited by examiner

*Primary Examiner* — Mark F Huff
*Assistant Examiner* — John S Ruggles
(74) *Attorney, Agent, or Firm* — Finnegan, Henderson, Farabow, Garrett & Dunner, L.L.P.

(57) ABSTRACT

A reflective mask comprising: a reflective layer that is arranged on a surface on a side on which EUV light is irradiated and reflects the EUV light; a buffer layer containing Cr that is arranged on a side of the reflective layer on which the EUV light is irradiated and covers an entire surface of the reflective layer; and a non-reflective layer that is arranged on a side of the buffer layer on which the EUV light is irradiated and in which an absorber that absorbs the irradiated EUV light is arranged in a position corresponding to a mask pattern to be reduced and transferred onto a wafer.

18 Claims, 3 Drawing Sheets

REFLECTIVE MASK AND MANUFACTURING METHOD FOR REFLECTIVE MASK

CROSS-REFERENCE TO RELATED APPLICATIONS

This application is based upon and claims the benefit of priority from the prior Japanese Patent Application No. 2008-193131, filed on Jul. 28, 2008; the entire contents of which are incorporated herein by reference.

BACKGROUND OF THE INVENTION

1. Field of the Invention

The present invention relates to a reflective mask, a manufacturing method for the reflective mask, and a manufacturing method for a semiconductor device.

2. Description of the Related Art

Extreme ultraviolet (EUV) lithography is an exposure method in which light (an X ray) having extremely short wavelength near 13.5 nanometers is used. The EUV lithography is prospective as a method of forming a finer pattern on a wafer than that formed by light exposure in the past (having wavelength of 193 manometers (ArF) or 248 nanometers (KrF).

The pattern formed on the wafer by the EUV lithography is, for example, a pattern smaller than 50 nanometers. Therefore, a technical level required for defect inspection and defect correction for a mask for forming a pattern to be transferred onto the wafer is high. For example, to form a pattern having width of 32 nanometers on the wafer using a 4X mask, it is necessary to form a pattern having width of 128 nanometers on the mask. To keep fluctuation in a pattern dimension on the wafer within 5%, it is necessary to keep dimension fluctuation of a mask pattern within 6.4 nanometers. Therefore, it is necessary to perform inspection of the mask pattern at accuracy of a dimension equal to or smaller than 6.4 nanometers. When a pattern finer than 32 nanometers is formed on the wafer, it is necessary to inspect the mask pattern in specifications stricter than 6.4 nanometers.

In the past, a reflective mask used for EUV exposure and the like is manufactured by arranging an EUV light absorber (a Ta compound, etc.) on a mask and etching the absorber according to a pattern to be exposed. In such a reflective mask, a buffer layer formed of Cr, a Cr compound such as CrN, or the like is arranged below an absorber layer as an etching stop layer (see, for example, Japanese Patent Application Laid-Open No. 2006-13494). The buffer layer is necessary for obtaining signal contrast with the absorber not only during the etching of the absorber but also during inspection of a mask pattern by an electron microscope. During mask pattern formation, the buffer layer is present over the entire mask between the absorber and a Mo/Si multilayer film for reflecting EUV light. Such a buffer layer causes deterioration in the intensity of reflected light. Therefore, after formation of an absorber pattern, a section without the absorber is etched and removed to expose the Mo/Si multilayer.

However, in the technology in the past, the inspection of the mask pattern is performed before the etching and removal of the buffer layer, i.e., the etching and removal of the buffer layer is performed after the inspection. Therefore, a defect that occurs in this etching process is not inspected. Examples of the defect that occurs in the etching process for the buffer layer include a partial (local) etching removal residue of a buffer layer material and a pattern dimension change due to redeposit of the removed buffer layer material on the absorber pattern. Therefore, a pattern is formed on the wafer by the mask in which the defect occurs. As a result, a pattern cannot be formed on the wafer in a desired dimension.

BRIEF SUMMARY OF THE INVENTION

A reflective mask according to an embodiment of the present invention comprises: a reflective layer that is arranged on a surface on a side on which EUV light is irradiated and reflects the EUV light;
a buffer layer containing Cr that is arranged on a side of the reflective layer on which the EUV light is irradiated and covers an entire surface of the reflective layer; and
a non-reflective layer that is arranged on a side of the buffer layer on which the EUV light is irradiated and in which an absorber that absorbs the irradiated EUV light is arranged in a position corresponding to a mask pattern to be reduced and transferred onto a wafer.

A manufacturing method for a reflective mask according to an embodiment of the present invention comprises: forming a reflective layer that reflects EUV light on a surface on a side on which the EUV light is irradiated;
forming a buffer layer containing Cr that covers an entire surface of the reflective layer on the side of the reflective layer on which the EUV light is irradiated; and
forming, as a non-reflective layer, an absorber that absorbs the irradiated EUV light on the side of the buffer layer on which the EUV light is irradiated and in a position corresponding to a mask pattern to be reduced and transferred onto a wafer.

A manufacturing method for a semiconductor device according to an embodiment of the present invention comprises: forming a reflective layer that reflects EUV light on a surface on a side on which the EUV light is irradiated;
forming a buffer layer containing Cr that covers an entire surface of the reflective layer on the side of the reflective layer on which the EUV light is irradiated;
forming, as a non-reflective layer, an absorber that absorbs the irradiated EUV light on the side of the buffer layer on which the EUV light is irradiated and in a position corresponding to a mask pattern to be reduced and transferred onto a wafer; and
manufacturing a semiconductor device using a reflective mask including the reflective layer, the buffer layer, and the non-reflective layer.

DETAILED DESCRIPTION OF THE INVENTION

Exemplary embodiments of the present invention are explained in detail below with reference to the accompanying drawings. The present invention is not limited by the embodiments.

Figure 1:
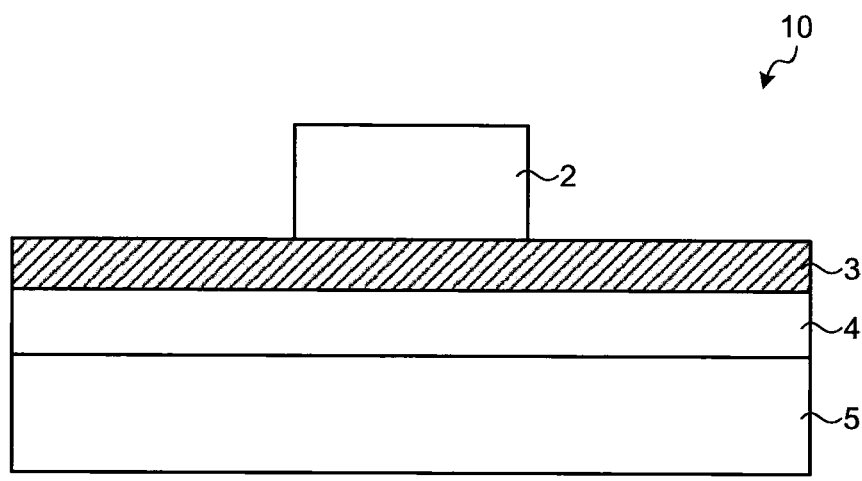
FIG. 1 is a diagram of a configuration of a mask according to a first embodiment of the present invention.

FIG. 1 is a diagram of a configuration of a mask according to a first embodiment of the present invention. In FIG. 1, a sectional view of a mask 10 is shown. The mask 10 is a reflective mask used for EUV exposure and includes an absorber (a non-reflective layer) 2, a buffer layer 3, a capping layer 4, and a reflective film (a reflective layer) 5. In the mask 10 shown in FIG. 1, the absorber 2 is formed on the upper surface side of the reflective film 5. However, when the mask 10 is mounted on an exposure apparatus, the mask 10 can be reversed and mounted. Specifically, the mask 10 can be mounted on the exposure apparatus with the absorber 2 set on the upper surface side or can be mounted on the exposure apparatus with the absorber 2 set on the lower surface side.

In the mask 10, the reflective film 5 is arranged on a glass substrate (not shown in the figure). The capping layer 4 is arranged on the upper side of the reflective film 5 and covers the entire surface of the reflective film 5. The buffer layer 3 is arranged on the upper side of the capping layer 4 and covers the entire surface of the capping layer 4. The patterned absorber 2 is arranged on the upper side of the buffer layer 3 and covers a part of the buffer layer 3. When the EUV exposure is performed by using the mask 10, EUV light is made obliquely incident from the absorber 2 side (a front surface side).

The reflective film 5 includes a material that reflects the EUV light. The reflective film 5 is, for example, an Mo/Si multilayer film. The Mo/Si multilayer film is a multilayer film formed by alternately stacking 4 nanometers of molybdenum (Mo) layers and silicon (Si) layers with thickness of, for example, 4 nanometers. A layer at the top layer (a layer directly joined with the capping layer 4) of the Mo/Si multilayer film can be a molybdenum layer or a silicon layer.

The capping layer 4 is a film for capping the reflective film 5 and is, for example, a silicon film. The capping layer 4 prevents oxidation of the film at the top layer of the multilayer film by covering the entire surface of the reflective film 5. The capping layer 4 has thickness of, for example, 10 nanometers.

The buffer layer 3 is an etch stop layer used when etching and defect correction for the absorber 2 are performed and is formed of, for example, Cr or a Cr compound. Therefore, the buffer layer 3 is formed of a material having a large selection ratio between the buffer layer 3 and the absorber 2 during etching. The buffer layer 3 has thickness of, for example, 3 nanometers. The absorber 2 includes a material that absorbs EUV light. The absorber 2 is formed of, for example, a Ta compound and has thickness of, for example, 70 nanometers.

To manufacture the mask 10, the absorber 2 is etched from a mask blank and patterned. The mask blank is a substrate including the reflective film 5, the capping layer 4, the buffer layer 3, and the absorber 2 not patterned. A resist material for absorber layer processing may be applied to a layer of the absorber 2. Therefore, the mask blank includes a substrate on which the absorber 2 before patterning covers the entire surface of the buffer layer 3. Thereafter, in this embodiment, the manufacturing of the mask 10 is completed without etching the buffer layer 3. Therefore, in the mask 10 according to this embodiment, the buffer layer 3 is present in both a section where the absorber 2 is not present (a section where the absorber 2 is etched) and a section where the absorber 2 is present (the buffer layer 3 is present on the entire surface of the capping layer 4).

EUV light irradiated in the vicinity of the absorber 2 on the mask 10 is absorbed by the absorber 2. EUV light irradiated on a position (the buffer layer 3) other than the absorber 2 is reflected on the buffer layer 3 and the reflective film 5 below the buffer layer 3. Consequently, only the EUV light reflected on the buffer layer 3 and the reflective film 5 of the lower layer of below the buffer layer 3 is sent to a wafer (not shown in the figure). A pattern corresponding to the pattern of the absorber 2 is reduced and transferred onto the wafer. The capping layer 4 and the reflective film 5 are separately formed. However, the capping layer 4 and the reflective film 5 can be integrally formed.

An expose amount (a dose) and contrast necessary for forming a pattern on the wafer changes according to the thickness of the buffer layer 3. Therefore, in this embodiment, the buffer layer 3 having appropriate thickness for obtaining a predetermined dose is formed on the mask 10 while securing predetermined contrast.

A relation between the contrast of EUV light irradiated on the wafer and the thickness of the buffer layer 3 and a relation between a dose necessary for forming a pattern on the wafer and the thickness of the buffer layer 3 are explained. In the following explanation, a transfer pattern on the wafer is lines and spaces arranged at intervals of 32 nanometers (1:1 equal interval array of 32 nanometers in width).

Figure 2:
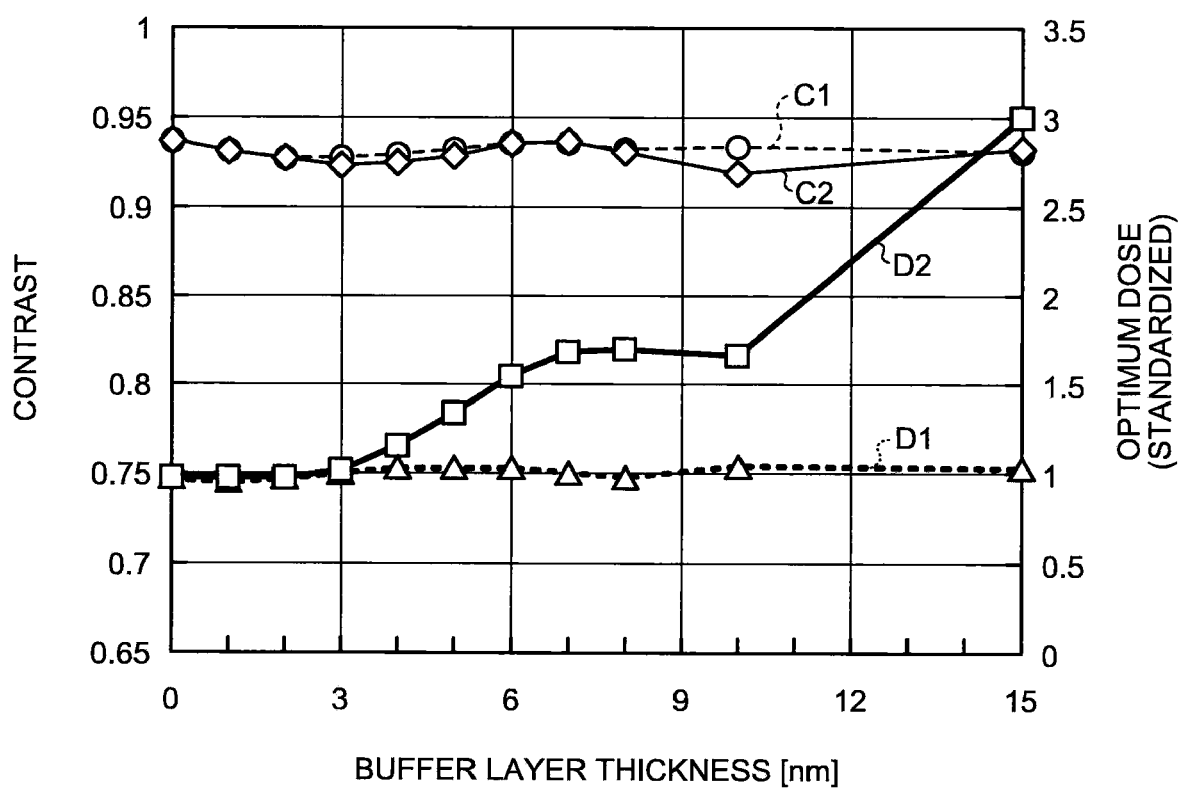
FIG. 2 is a diagram for explaining a relation between the thickness of a buffer layer and exposure conditions.

FIG. 2 is a diagram for explaining a relation between the thickness of a buffer layer and exposure conditions. In FIG. 2, a calculation result of contrast and a calculation result of an optimum dose are shown. The contrast is the contrast of EUV light irradiated on the wafer via the mask 10. The contrast is calculated by using, for example, a maximum (max) and a minimum (min) of light intensity of the EUV light irradiated on the wafer. Contrast C is a value calculated by a formula $C=(max-min)/(max+min)$. The optimum dose is an exposure amount necessary for forming a pattern on the wafer and is standardized.

In FIG. 2, a calculation result obtained when EUV exposure is performed by the mask in the past and a calculation result obtained when EUV exposure is performed by the mask 10 according to this embodiment are shown. The thickness of the buffer layer in the past is the thickness of the buffer layer 3 present below the absorber 2. Contract C1 is contrast obtained when EUV exposure is performed by the mask in the past. Contrast C2 is contrast obtained when EUV exposure is performed by the mask 10 according to this embodiment. A dose D1 is an optimum dose obtained when EUV exposure is performed by the mask in the past. A dose D2 is an optimum dose obtained when EUV exposure is performed by the mask 10 according to this embodiment.

Figure 3:
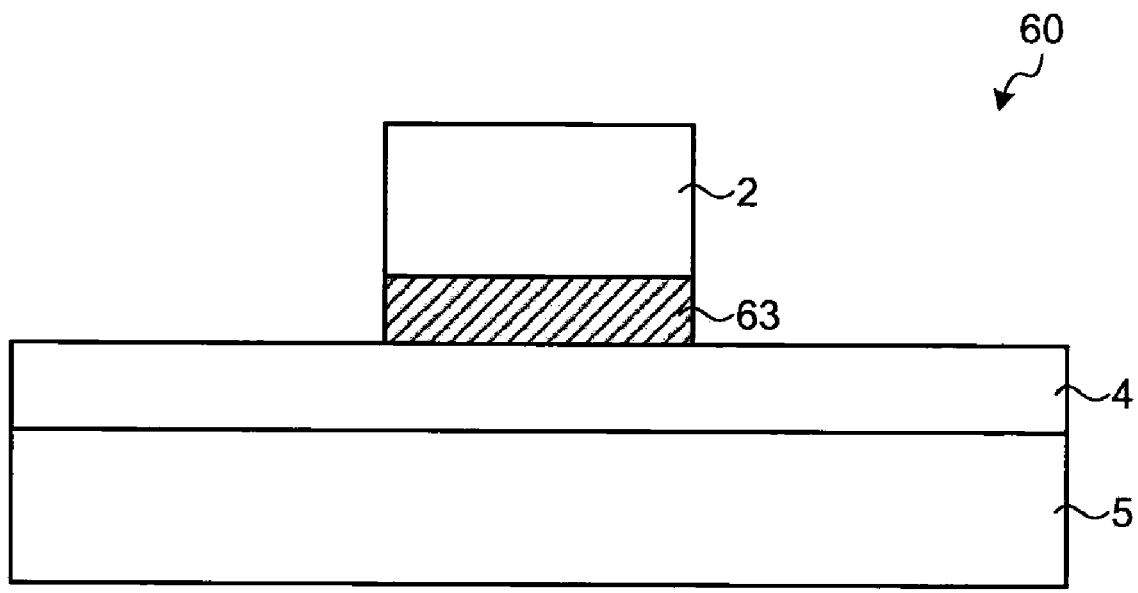
FIG. 3 is a diagram of a configuration of a mask in the past.

FIG. 3 is a diagram of a configuration of the mask in the past. In FIG. 3, a sectional view of a mask 60 in the past is shown. In the mask 6 in the past, a part (a section except a section below the absorber 2) of a buffer layer 63 is etched from the mask 60 and the buffer layer 63 except the section below the absorber 2 is removed. Therefore, the capping layer 4 is exposed in a section except a position where the absorber 2 is formed. Specifically, in the mask 60, the reflective film 5 is arranged on a glass substrate. The capping layer 4 is arranged on the upper side of the reflective film 5 and covers the entire surface of the reflective film 5. The patterned buffer layer 63 is arranged on the upper side of the capping layer 4 and covers a part of the capping layer 4. The patterned absorber 2 is arranged on the upper side of the buffer layer 63 and covers a part of the buffer layer 63. In the mask 60, the buffer layer 63 and the absorber 2 are patterned in the same shape.

It is seen that, when the thickness of the buffer layers 3 and 63 is gradually reduced from 15 nanometers, the contrasts C1 and C2 change.

In the past, the thickness of a buffer layer is 10 nanometers to 15 nanometers. The contrast C1 is larger than the contrast C2 in this thickness. Depending on a thickness condition of the buffer layer 3, the contrast C2 obtained when the buffer layer 3 is left on the reflecting section is larger than the contrast C1. It is seen that, for example, when the thickness of the buffer layer 3 is 5 nanometers to 6 nanometers, sufficient contrast is obtained even if the buffer layer 3 is not etched and removed.

When the intensity of reflected light decreases, it is necessary to extend exposure time for obtaining an exposure amount of EUV light necessary for forming a desired pattern on a wafer. Therefore, throughput of exposure is deteriorated. Therefore, in this embodiment, the buffer layer 3 having thickness with which a pattern can be formed on the wafer with exposure time for not deteriorating the throughput of exposure is used.

In FIG. 2, the doses D1 and D2 are calculated with reference to a dose necessary when a buffer layer is etched and removed and the thickness of the buffer layer is 15 nanometers. As indicated by the dose D1, when the buffer layer 63 is etched and removed, a substantially fixed dose is necessary irrespective of the thickness of the buffer layer 63. On the other hand, as indicated by the dose D2, when the buffer layer 3 is not etched and removed and is left in the reflecting section, the necessary dose decreases as the thickness of the buffer layer 3 decreases.

In the case of the dose D2, when the thickness of the buffer layer 3 decreases to be equal to or smaller than 3 nanometers, a pattern can be formed on the wafer with a dose substantially equal to a dose obtained when the buffer layer 63 is etched and removed. When a slight increase in the dose is allowed, even when the buffer layer 3 has thickness of 4 nanometers to 5 nanometers, it is possible to omit the etching and removal of the buffer layer 3.

Even in a mask structure in which the buffer layer 3 is not etched and removed (a mask structure in which the buffer layer 3 is left in the reflecting section) as explained above, it is seen that there is the thickness of the buffer layer 3 with which sufficient contrast can be obtained and EUV exposure can be performed with a dose in an allowable range.

In this embodiment, for example, the thickness of the buffer layer 3 is optimized by applying, for example, thickness equal to or smaller than 3 nanometers as the thickness of the buffer layer 3. By determining the optimum thickness of the buffer layer 3 in this way, it is possible to omit an etching and removing process for the buffer layer 3 in a process for manufacturing a reflective mask for EUV. A semiconductor device is manufactured by using, for EUV exposure processing, the mask 10 manufactured as explained above.

In the explanation of this embodiment, the lines and spaces arranged at the intervals of 32 nanometers are subjected to EUV exposure. A shape and the size of a pattern to be subjected to EUV exposure can be any shape and size. When a plurality of kinds of patterns are included in the pattern to be subjected to EUV exposure, thickness optimized for a smallest pattern shape is applied.

Figure 4:
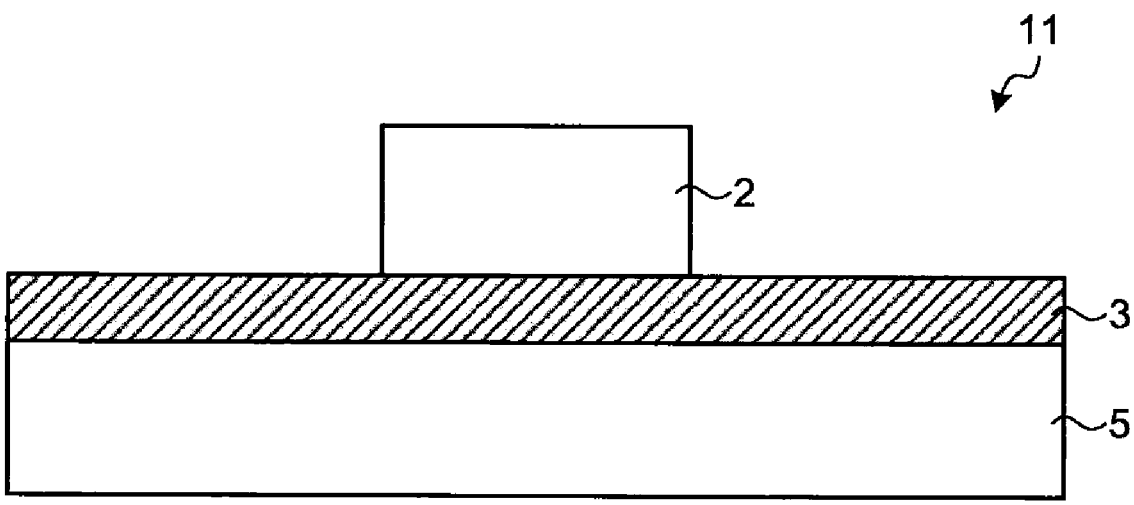
FIG. 4 is a diagram of another configuration example of the mask according to the first embodiment.

In the explanation of the embodiment, the mask 10 includes the capping layer 4. However, a mask does not have to include the capping layer 4. FIG. 4 is a diagram of another configuration example of the mask according to the first embodiment. In FIG. 4, a sectional view of a mask 11 is shown. The mask 11 includes the absorber 2, the buffer layer 3, and the reflective film 5.

In the mask 11, the reflective film 5 is arranged on a glass substrate. The buffer layer 3 is arranged on the upper side of the reflective film 5 and covers the entire surface of the reflective film 5. The patterned absorber 2 is arranged on the upper side of the buffer layer 3 and covers a part of the buffer layer 3.

When the mask 11 is configured such as explained above, the buffer layer 3 functions as a capping layer. As explained above, because the mask 11 does not include the capping layer 4, the mask 11 is simpler than the mask 10. Further, the reflecting section of the mask 11 can reflect EUV light at reflectance larger than that of the reflecting section of the mask 10.

In this embodiment, because the buffer layer 3 and the capping layer 4 are not etched, an etching selection ratio between the buffer layer 3 and the capping layer 4 can be small. Therefore, the capping layer 4 can be formed of a material different from silicon.

Even when foreign particles or the like adhere to the reflecting section of the mask 10, because the buffer layer 3 covers an upper part of the reflecting section, damage to the capping layer 4 and the reflective film 5 in foreign particle removal (defect correction for the absorber 2) by a focused ion beam (FIB), an electron beam, or an atomic force microscope (AFM) can be prevented. Consequently, a phase defect of the mask 10 can be reduced. Because etching of the buffer layer 3 is not performed, occurrence of a defect due to a removal residue of the buffer layer 3 can be prevented. Further, foreign particles can be prevented from depositing on the absorber 2. Because manufacturing processes for the mask 10 can be reduced in this way, processes that could cause deterioration in dimension controllability decrease. Therefore, it is possible to form a pattern on a wafer in a dimension as designed. Consequently, yield in manufacturing a semiconductor device using the mask 10 is improved. Further, because it is possible to form a fine pattern with occurrence of a defect prevented, it is possible to manufacture a semiconductor device having high performance.

Because the etching and removal process for the buffer layer 3 can be omitted, it is possible to manufacture the mask 10 at low cost and manufacture the mask 10 in a short period. In other words, mask manufacturing turn around time (TAT) can be reduced and manufacturing cost can be reduced through a reduction in the number of steps of the mask manufacturing process. As a result, the mask 10 and a semiconductor device manufactured by using the mask 10 can be put on the market at earlier timing and an opportunity loss can be reduced.

As explained above, according to the first embodiment, the buffer layer 3 of the mask 10 or 11 is arranged on the upper side of the reflective film 5 without being etched. Therefore, pattern dimension controllability in forming a pattern on a wafer with the mask 10 or 11 is improved. In other words, a dimension of a pattern formed on the wafer can be accurately controlled.

In a second embodiment of the present invention, the buffer layer 3 is etched by predetermined thickness to form the buffer layer 3 having desired thickness in a mask.

Figure 5:
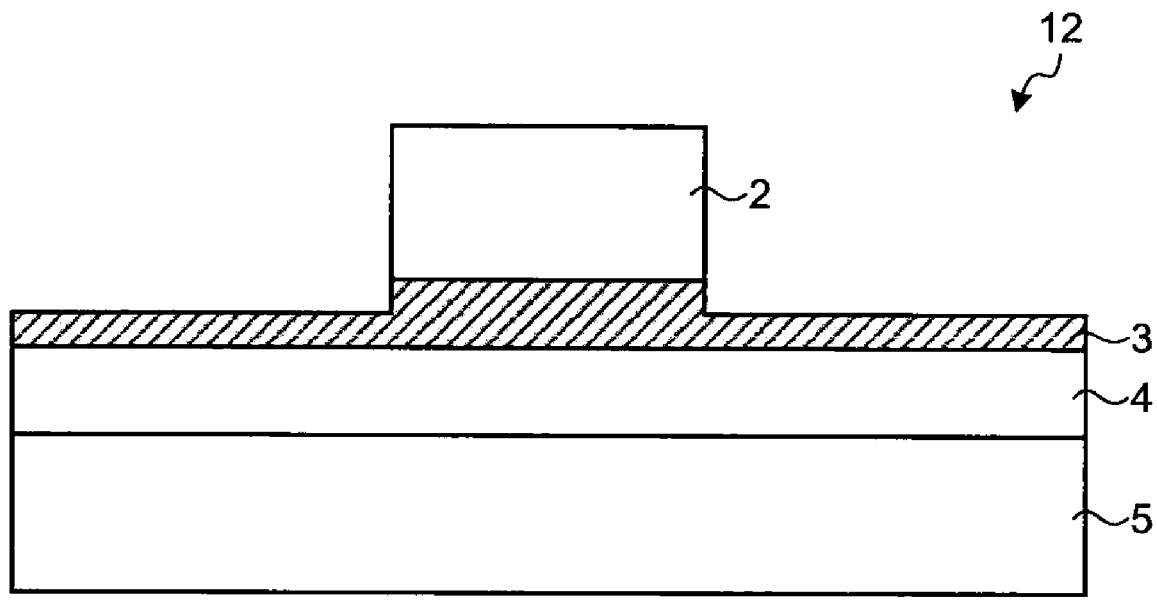
FIG. 5 is a diagram of a configuration of a mask according to a second embodiment of the present invention.

FIG. 5 is a diagram of a configuration of a mask according to the second embodiment. In FIG. 5, a sectional view of a mask 12 is shown. Components shown in FIG. 5 that attain functions same as those of the mask 10 according to the first embodiment shown in FIG. 1 are denoted by the same reference numerals and redundant explanation of the components is omitted.

In the mask 12, the reflective film 5 is arranged on a glass substrate (not shown). The capping layer 4 is arranged on the upper side of the reflective film 5 and covers the entire surface of the reflective film 5. The buffer layer 3 is arranged on the upper side of the capping layer 4 and covers the entire surface of the capping layer 4. The buffer layer 3 in this embodiment is etched from a mask blank by predetermined thickness. Therefore, the thickness of the buffer layer 3 is different in a reflecting section of the mask 12 and a non-reflecting section of the mask 12 (a lower part of the absorber 2). The patterned absorber 2 is arranged as a non-reflecting section on the upper side of the buffer layer 3 and covers a part of the buffer layer 3.

To manufacture the mask 12, the absorber 2 is etched from the mask blank and patterned. Further, in this embodiment, the buffer layer 3 is etched by predetermined thickness to have predetermined final thickness (e.g., 3 nanometers) in a place where the absorber 2 is not present. Consequently, the buffer layer 3 having the predetermined thickness is formed in the mask 12 to complete the manufacturing of the mask 12. Therefore, in the mask 12 according to this embodiment, the buffer layer 3 is present in both a section where the absorber 12 is not present and a section where the absorber 2 is present.

The thickness of the buffer layer 3 in the reflecting section of the mask 12 is set to thickness (e.g., equal to or smaller than 3 nanometers) calculated by a calculation method same as that in the first embodiment explained with reference to FIG. 2. This makes it possible to obtain the mask 12 having merits same as those of the mask 10 according to the first embodiment.

Figure 6:
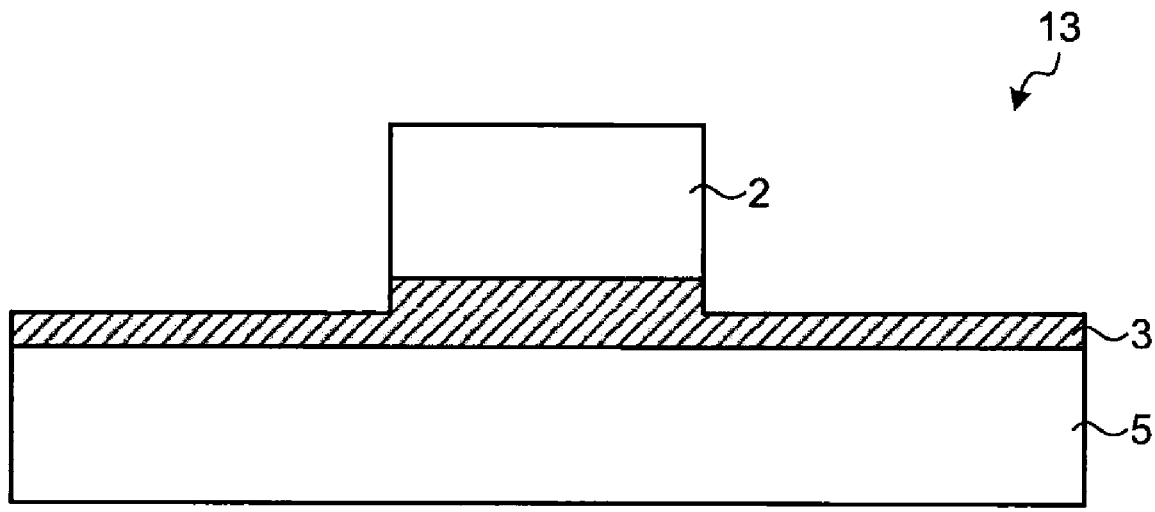
FIG. 6 is a diagram of another configuration example of the mask according to the second embodiment.

In the explanation of this embodiment, the mask 12 includes the capping layer 4. However, a mask does not have to include the capping layer 4. FIG. 6 is a diagram of another configuration example of the mask according to the second embodiment. In FIG. 6, a sectional view of the mask 13 is shown. The mask 13 includes the absorber 2, the buffer layer 3, and the reflective film 5.

In the mask 13, the reflective film 5 is arranged on a glass substrate. The buffer layer 3 is arranged on the upper side of the reflective film 5 and covers the entire surface of the reflective film 5. The patterned absorber 2 is arranged on the upper side of the buffer layer 3 and covers a part of the buffer layer 3.

When the mask 13 is configured such as explained above, the buffer layer 3 functions as a capping layer. As explained above, because the mask 13 does not include the capping layer 4, the mask 13 is simpler than the mask 12. Further, the reflecting section of the mask 13 can reflect EUV light at reflectance larger than that of the reflecting section of the mask 12.

As explained above, according to the second embodiment, the buffer layer 3 of the mask 12 or 13 is etched to have predetermined thickness to optimize the thickness of the buffer layer 3. Therefore, pattern dimension controllability in forming a pattern on a wafer with the mask 12 or 13 is improved.

Because the buffer layer 3 is etched, it is possible to easily form the buffer layer 3 having desired thickness corresponding to exposure conditions. Further, because the thickness of the buffer layer 3 is optimized, it is possible to form a pattern on a wafer without increasing an optimum dose.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A reflective mask comprising:
    a reflective layer that reflects EUV light;
    a buffer layer containing Cr that is arranged on the reflective layer and covers an entire surface of the reflective layer; and
    an absorber, arranged on the reflective layer, to absorb the EUV light, the absorber being used as a mask pattern to be reduced and transferred onto a wafer, wherein
    a thickness of the buffer layer is selected such that a difference between a first contrast and a second contrast falls in an allowable range,
    the first contrast being a contrast between the EUV light reflected on the reflective layer and with which the wafer is irradiated, and the EUV light reflected on the absorber and with which the wafer is irradiated when the buffer layer is arranged only below the absorber, and
    the second contrast being a contrast between the EUV light reflected on the reflective layer and with which the wafer is irradiated, and the EUV light reflected on the absorber and with which the wafer is irradiated when the buffer layer is arranged on the entire surface of the reflective layer.

2. The reflective mask according to claim 1, wherein a thickness of the buffer layer located below the absorber is larger than a thickness in a position where the absorber is not formed on the buffer layer.

3. The reflective mask according to claim 1, further comprising a capping layer that covers the entire surface of the reflective layer between the reflective layer and the buffer layer, wherein
    a first exposure amount of the EUV light being an exposure amount necessary for forming a pattern on the wafer and a second exposure amount of the EUV light being an exposure amount necessary for forming a pattern on the wafer when the buffer layer is present only below the absorber, the thickness of the buffer layer is selected such that a difference between the first exposure amount and the second exposure amount falls in an allowable range.

4. The reflective mask according to claim 3, wherein a material of the capping layer is a material containing silicon.

5. The reflective mask according to claim 1, further comprising a capping layer that covers the entire surface of the reflective layer between the reflective layer and the buffer layer, wherein
    the buffer layer covers the entire surface of the reflective layer by covering an entire surface of the capping layer.

6. The reflective mask according to claim 1, wherein
    the reflective layer is an Mo/Si multilayer film formed by alternately stacking molybdenum and silicon, and
    a top layer of the reflective layer and the buffer layer are directly set in contact with each other.

7. The reflective mask according to claim 1, wherein the buffer layer is formed of Cr or a Cr compound.

8. The reflective mask according to claim 1, wherein the thickness of the buffer layer is 5 nanometers to 6 nanometers.

9. The reflective mask according to claim 1, wherein the thickness of the buffer layer is equal to or smaller than 3 nanometers.

10. The reflective mask according to claim 1, wherein the thickness of the buffer layer is 4 nanometers to 5 nanometers.

11. A manufacturing method for a reflective mask, comprising:
    forming a reflective layer that reflects EUV light on a surface on a side which is irradiated with the EUV;
    forming a buffer layer containing Cr that covers an entire surface of the reflective layer; and
    forming an absorber that absorbs the EUV light on the buffer layer as a mask pattern to be reduced and transferred onto a wafer, wherein the buffer layer is formed to have a thickness such that a difference between a first contrast and a second contrast falls in an allowable range, the first contrast being a contrast between the EUV light reflected on the reflective layer and with which the wafer is irradiated, and the EUV light reflected on the absorber and with which the wafer is irradiated when the buffer layer is arranged only below the absorber, and the second contrast being a contrast between the EUV light reflected on the reflective layer and with which the wafer is irradiated, and the EUV light reflected on the absorber and with which the wafer is irradiated when the buffer layer is arranged on the entire surface of the reflective layer.

12. The manufacturing method for a reflective mask according to claim 11, wherein, in forming the buffer layer, the thickness of the buffer layer is selected such that a difference between a first exposure amount and a second exposure amount falls in an allowable range, the first exposure amount being an exposure amount necessary for forming a pattern on the wafer and the second exposure amount being an exposure amount necessary for forming a pattern on the wafer if the buffer layer were present only below the absorber.

13. The manufacturing method for a reflective mask according to claim 11, further comprising etching the buffer layer in a position where the absorber is not formed such that a thickness of the buffer layer located below the absorber is larger than a thickness of the buffer layer in the position where the absorber is not formed on the buffer layer.

14. The manufacturing method for a reflective mask according to claim 13, wherein the buffer layer is etched to the thickness selected such that a difference between a first exposure amount necessary for forming a pattern on the wafer and a second exposure amount necessary for forming a pattern on the wafer if the buffer layer were present only below the absorber falls in an allowable range.

15. The manufacturing method for a reflective mask according to claim 11, further comprising etching the buffer layer in a position where the absorber is not formed to the thickness selected such that the difference between the first contrast and the second contrast falls in the allowable range.

16. The manufacturing method for a reflective mask according to claim 11, wherein the buffer layer is formed to have a thickness of 5 nanometers to 6 nanometers.

17. The manufacturing method for a reflective mask according to claim 11, wherein the buffer layer is formed to have a thickness equal to or smaller than 3 nanometers.

18. The manufacturing method for a reflective mask according to claim 11, wherein the buffer layer is formed to have a thickness of 4 nanometers to 5 nanometers.

* * * * *